(12) United States Patent
Shirasaki

(10) Patent No.: US 8,309,279 B2
(45) Date of Patent: Nov. 13, 2012

(54) PELLICLE FOR LITHOGRAPHY

(75) Inventor: Toru Shirasaki, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 170 days.

(21) Appl. No.: 12/929,555

(22) Filed: Feb. 1, 2011

(65) Prior Publication Data
US 2011/0195351 A1 Aug. 11, 2011

(30) Foreign Application Priority Data
Feb. 8, 2010 (JP) .................. 2010-025300

(51) Int. Cl.
*G03F 1/62* (2012.01)
*G03F 1/64* (2012.01)

(52) U.S. Cl. .................................................. 430/5

(58) Field of Classification Search ......... 430/5; 428/14
See application file for complete search history.

(56) References Cited

U.S. PATENT DOCUMENTS
2009/0246644 A1* 10/2009 Chakravorty et al. ............ 430/5
* cited by examiner

*Primary Examiner* — Stephen Rosasco
(74) *Attorney, Agent, or Firm* — Manabu Kanesaka

(57) ABSTRACT

There is provided a pellicle in which the mask-bonding adhesive is formed to have a corner-rounded cross section in a shape akin to a trapezoid whose upper parallel side represents the face of the mask-bonding adhesive layer by which the adhesive layer is attached to the pellicle frame, and whose lower parallel side is not shorter than the upper parallel side, and the base angles of the trapezoid are 90 degrees or smaller but not smaller than 75 degrees, when the lower parallel side is assumed to be the base of the trapezoid.

4 Claims, 3 Drawing Sheets

F I G. 1
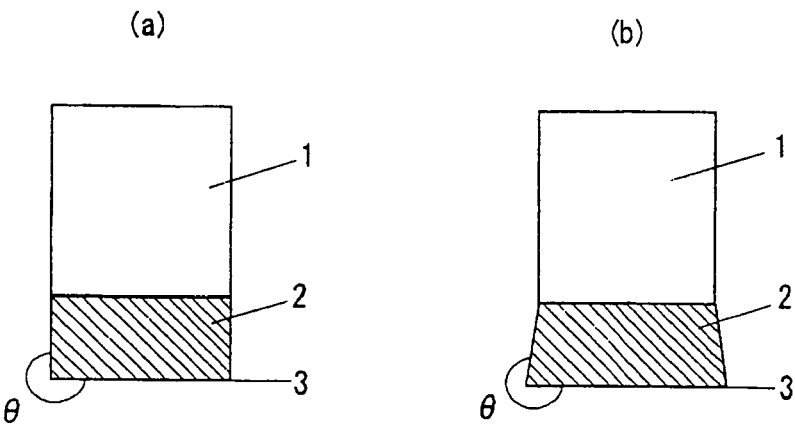
F I G. 2
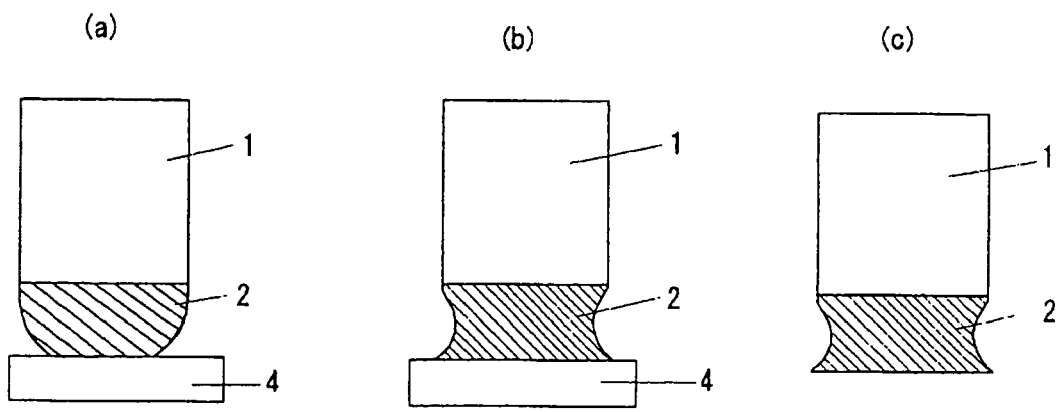

F I G. 3
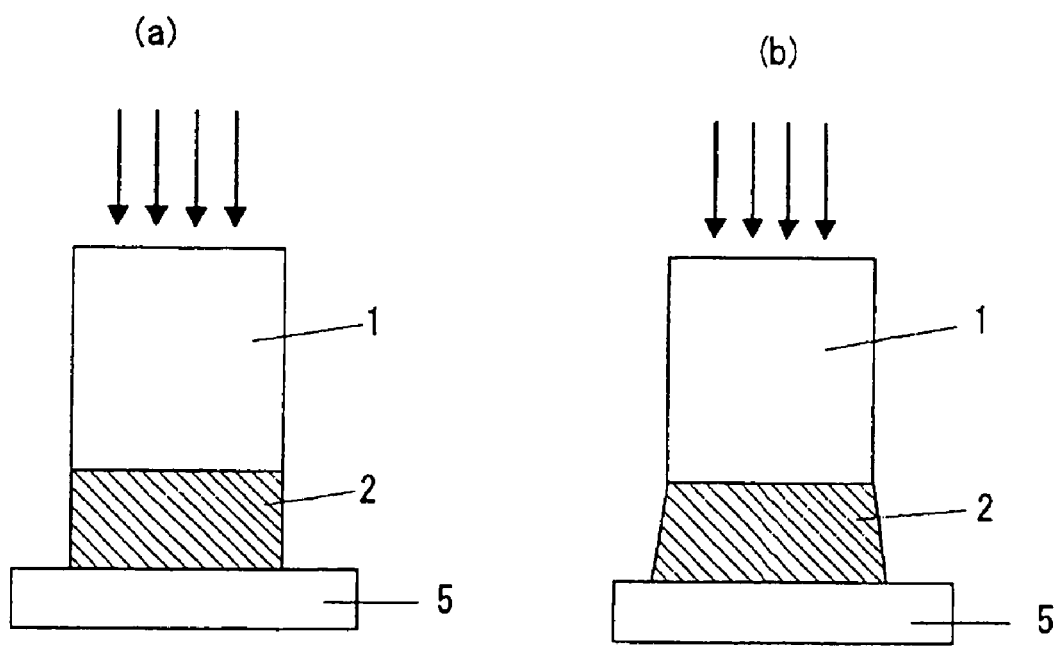

PELLICLE FOR LITHOGRAPHY

The present application claims priority from Japanese Application No. 2010-025300 filed on Feb. 8, 2010, the disclosure of which is hereby incorporated by reference herein in its entirety.

FIELD OF THE INVENTION

This invention concerns a pellicle for lithography used as a dust-fender employed in lithographic printing to manufacture semiconductor devices such as LSI and super LSI.

TECHNICAL BACKGROUND OF THE INVENTION

In manufacturing semiconductor devices such as LSI and super-LSI or in manufacturing a liquid crystal display board or the like, a pattern is made by irradiating light to an exposure original plate such as a semiconductor wafer or an original plate for liquid crystal, but if a dust particle gets to adhere to the exposure original plate, the dust particle absorbs the light or refracts it, giving rise to deformation of a transferred pattern and roughened edges, which lead to problems such as a damaged dimension, a poor quality and a deformed appearance, lowering the performance and the manufacture yield of the semiconductor devices and the liquid crystal display.

Thus, these works are usually performed in a clean room, but it is still difficult to keep the exposure original plate in a normal state all the time; therefore, a pellicle, which transmits the exposure light well, is attached to a surface of the exposure original plate as a dust-fender.

Under such circumstances, dust does not directly adhere to the surface of the exposure original plate but only onto the pellicle membrane, and thus, in lithography operation, by setting a photo focus on the pattern formed on the exposure original plate, the dust particles on the pellicle membrane fail to relate themselves to the image transfer performance.

A pellicle is built up of a pellicle frame, which is usually made of aluminum or a stainless steel or polyethylene or the like, and a transparent pellicle membrane usually made of cellulose nitrate or cellulose acetate or the like, which transmits light well; this membrane is attached to one of the two frame faces (hereinafter referred to as "upper frame face") after laying a solvent capable of dissolving the pellicle membrane on the upper frame face and drying the solvent by air flow (ref. Publication-in-patent 1), or after laying an adhesive such as acrylic resin and epoxy resin (ref. Publications-in-patent 2, 3 and 4); furthermore, on the other one of the two frame faces (hereinafter referred to as "lower frame face") is laid an adhesive layer made of a polybutene resin, a polyvinyl acetate resin, an acrylic resin, a silicone resin or the like, and over this adhesive layer (hereinafter also referred to as "mask-bonding adhesive layer") is laid a releasable liner (separator) for protecting the adhesive layer.

In recent years, the requirement for the resolution of lithography has become heightened gradually, and in order to attain such higher resolutions the light sources having shorter and shorter wavelengths have come to be adopted. In practice, ultraviolet lights [g-line (436 nm), I-line (365 nm), KrF excimer lasers (248 nm)] are newly employed, and more recently ArF excimer lasers (193 nm) have begun to be used.

As the wavelengths of the exposure lights are shifted toward shorter lengths, a new problem has arisen wherein a deformation of the lithographic image is caused by the deformed flatness of exposure original plate (mask).

It has been pointed out that one of the causes for the deformation of the flatness of the exposure original plate is the less admirable flatness of the pellicle which is attached to the exposure original plate. The inventor hereof previously presented a proposal for controlling the mask deformation caused by pellicle attachment to the mask by means of an improvement in the flatness of the mask-bonding adhesive layer (ref. Publication-in-patent 5).

In this Publication-in-patent 5, it is proposed to make flatter the surface of the mask-bonding adhesive layer laid on the lower frame face of the pellicle frame by pressing the pellicle frame on a flat plate having a high flatness by the weight of the pellicle frame itself.

That invention certainly improved the maintenance of the high flatness of the mask greatly; however, there have still been occasional incidents observed wherein the transferred light image was deformed, especially in the cases wherein the masks are exposed to lights of shorter wavelengths. The cause for this deformation was found to be one due to the deformation of the mask-bonding adhesive layer itself: when the pellicle is being brought to be attached to the mask by pressure, the mask-bonding adhesive layer may not receive the pressure quite evenly and thus is locally deformed or locally more depressed; but, nonetheless the entirety of the adhesive layer surface is pressed to flatten to meet the flat surface of the mask; all the same, when the pressure imposed to attach the pellicle frame onto the mask is removed, that portion of the adhesive layer which had been locally depressed deeper tries to recover its former deformation but being unable to detach itself from the mask owing to the adhesiveness of itself, it forces the mask to accompany it as it tries to restore its former deformed shape, whereby the mask is deformed too to an infinitesimal degree but enough to cause the light image deformation. And this phenomenon is more observable when the wavelength of the exposure light is shorter, because even the infinitesimal deformation of the mask flatness can be felt by the extremely high resolution of the transferred pattern.

This phenomenon shall be explained in detail with reference to FIG. 4 attached hereto.

FIG. 4(a) represents a step whereat an adhesive layer 12 is applied to one of the frame faces of the pellicle frame 11, and it is seen that the exposed lower face of the adhesive layer is convex owing to the viscosity and surface tension of the adhesive 12. As of the step represented by FIG. 4(b), the pellicle frame 11 is rested on a flat plate 13 with the exposed face of the adhesive (layer) 12 facing the flat plate 13 so that most of the exposed face of the adhesive layer is flattened under the weight of the pellicle frame. On this occasion, the adhesive layer 12 is cured to harden to an extent that the adhesive surface retains tackiness. FIG. 4(c) represents a step whereat the pellicle frame 11 has been removed from the flat plate 13. On this occasion, the cross section of the adhesive layer 12, as seen in FIG. 4(c), would have become such that the angle a measured from the line 14 representing the flattened face of the adhesive layer 12 round to the line 15, which is tangential to the convex curve, representing the not-flattened face of the adhesive, at the point where the line 14 and said convex curve join together, is less than 270 degrees but greater than 180 degrees. In other words, the profile of the adhesive layer 12, as seen in FIG. 4(c), converges downwardly.

At a step represented by FIG. 4(d), the pellicle is placed on a mask 16 with the adhesive layer 12 facing the mask 16, and the pellicle is affixed to the mask 16 by pressuring them together. On this occasion, the adhesive layer 12, which is convergent externally (or downwardly in the figure), is pressed to creep sideways and wound occasionally expand beyond the frame face and as a result that expanded portions get in contact with the flat surface of the mask 16. Then, the expanded portions of the adhesive layer too get adhered to the mask, and, even after the pressure is removed, may not be restored to the pre-pressuring shape but stay adhered to the mask face owing to the strength of its tackiness. Consequently, the shrinking force (force to restore the former shape) of the adhesive layer 12 would cause the mask to deform to an inconvenient extent.

PRIOR PUBLICATIONS

Publications-in-Patent

[Publication-in-Patent 1] Japan Published patent application Showa 58-219023
[Publication-in-Patent 2] U.S. Pat. No. 4,861,402
[Publication-in-Patent 3] Japan Examined patent application publication Showa 63-27707
[Publication-in-Patent 4] Japan Published patent application Heisei 7-168345
[Publication-in-Patent 5] Japan Not-yet-Published patent application No. 2008-119809

SUMMARY OF THE INVENTION

The Problems the Invention Seeks to Solve

In view of the above-mentioned circumstances, the present invention seeks to propose a pellicle for lithography that scarcely imparts deformation to the mask to which it is affixed.

Means to Solve the Problems

The basic concept of the present invention lies in that a cross section of the pellicle taken across a plane vertical to any frame bar is such that the profile of the mask-bonding adhesive layer is generally a rectangle or a trapezoid, the latter having its shorter parallel side affixed to the frame's lower face.

In other words, the angle θ measured between the first straight line representing the flattened bottom face of the adhesive layer and the second straight line which represents a side face of the adhesive layer is 270 degrees or greater but far less than 360 degrees. It is, however, noted that in practical situations, due to the physical nature of the adhesive, there will be no pointed corners in either the rectangular profile or the trapezoidal profile of the adhesive layer, such as ones seen in FIGS. 1(a) and (b), but they are rounded, and moreover, in more cases than not, the lines representing the side faces of the adhesive become concaved, as seen in FIGS. 2(b) and (c), so that one would call the profile as a rounded rectangle with roundly concaved lateral sides or rounded trapezoid with roundly concaved lateral (non-parallel) sides (or legs).

Therefore, the invention can be defined as a pellicle for lithography constituted by a pellicle frame having a pair of parallel frame faces, and a pellicle membrane tensely bonded on one of the frame faces, and a mask-bonding adhesive layer attached to the other one of the frame faces, an improvement consisting in that the mask-bonding adhesive layer has a corner-rounded cross section in a shape akin to a trapezoid of which a first one of two parallel sides represents the face of the mask-bonding adhesive layer by which the adhesive layer is attached to the pellicle frame, and in that a second one of the two parallel sides of the trapezoid is not shorter than the first parallel side, and in that base angles of the trapezoid are 90 degrees or smaller, the second parallel side being assumed the base of the trapezoid.

When the second parallel side is equal to the first parallel side and the base angles are 90 degrees, the cross section of the mask-bonding adhesive layer is rectangle.

The trapezoidal cross section of the mask-bonding adhesive layer often has inwardly concaved legs.

The base angles of the trapezoid preferably are not smaller than 75 degrees for the stability of the adhesive layer.

Effect of the Invention

According to the present invention, the pellicle for the lithography is fabricated such that the mask-bonding adhesive layer has a cross-sectional profile of a generally rectangular or generally trapezoidal shape, having that parallel side which is remote from the pellicle frame equal to or greater than the other parallel side, so that even when the pellicle is attached to the mask by pressure, the side faces of the adhesive layer are not apt to come in contact with the mask face, and hence when the pressure is removed, the adhesive layer, as it restores its pre-pressure form, does not deform the mask; consequently, the possibility of deformation and translation in the focused image during the lithographic operation is greatly minimized to bring in increased yield.

BRIEF DESCRIPTION OF DRAWINGS

FIG. 1 is a cross-sectional view of a part of a pellicle frame taken across a plane vertical to any frame bar, showing the concept of the pellicle for lithography according to the present invention by way of typical examples wherein, in the case of (a), the angel between the bottom face and a side face of the mask-bonding adhesive layer is 270 degrees and, in the case of (b), the same angle is greater than 270 degrees.

FIG. 2 is a cross-sectional view of a part of a pellicle frame taken across a plane vertical to any frame bar, showing the procedure for forming the shape of the mask-bonding adhesive layer, wherein, on the occasion of (a), the adhesive has been applied to the pellicle frame and the bottom face of the adhesive layer is flattened against the flat plate and, on the occasion of (b), some amount of the adhesive has flowed down owing to its own weight and, on the occasion of (c), the adhesive layer has been cured to harden to an extent that the adhesive surface retains sufficient tackiness and removed from the flat plate.

FIG. 3 is a cross-sectional view of a part of pellicle frame taken across a plane vertical to any frame bar, showing a step whereat the pellicle for lithography of the present invention is attached to the mask wherein, in the case of (a), the profile of the mask-bonding adhesive layer is a rectangle and, in the case of (b), the profile of the mask-bonding adhesive layer is a trapezoid in which the angle included between the bottom side and a lateral side is greater than 270 degrees.

DETAILED DESCRIPTION OF THE INVENTION

Figure 4:
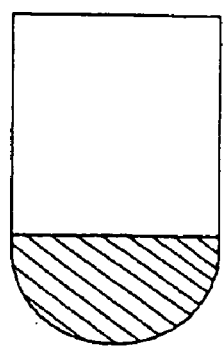
FIG. 4 is a cross-sectional view of a part of a pellicle frame taken across a plane vertical to any frame bar, showing a conventional procedure for forming the shape of the mask-bonding adhesive layer, wherein, on the occasion of (a), the adhesive has been applied to the mask-bonding face of the pellicle frame and, on the occasion of (b), the bottom face of the adhesive layer has been flattened against a flat plate and, on the occasion of (c), the pellicle frame has been removed from the flat plate and, on the occasion of (d), the pellicle has been attached to the mask and, on the occasion of (e), the pressure by which the pellicle is imposed on the mask has been removed.
Figure 4:
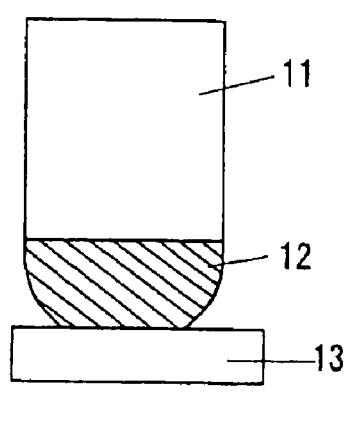
Figure 4:
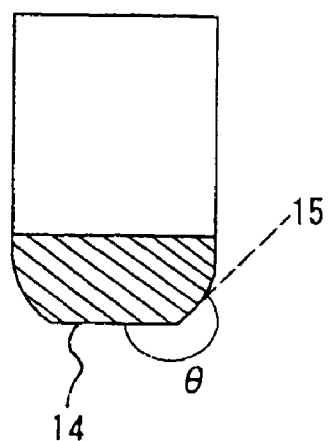
Figure 4:
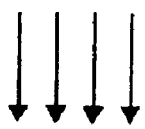
Figure 4:
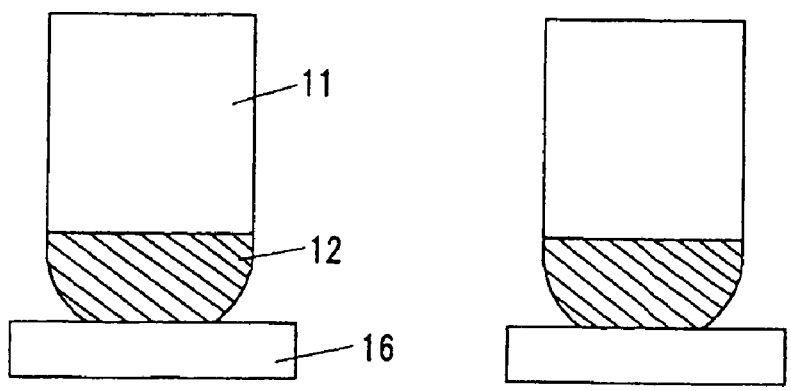

Next, we will discuss the invention in detail with the attached drawings as the reference.

FIG. 1 shows two conceptional examples of the invention wherein, in the case of (a), the angel theta between the bottom face and a side face of the mask-bonding adhesive layer 2 is 270 degrees and, in the case of (b), the same angle theta is a little greater than 270 degrees.

In FIG. 1, the reference numeral 1 designates a pellicle frame, and 2 the mask-bonding adhesive layer. In reality the edge portion 3 where the bottom face and a side face of the adhesive layer 2 meet is rounded to an extent of 10 micrometer radius or smaller, and hence the nominal angle theta included between the bottom face and a side face of the adhesive layer 2 means an angle that is included between the two hypothetical planes of which one includes the bottom face of the adhesive layer 2 and of which the other one includes a side face of the adhesive layer 2. Furthermore, since a side face of the adhesive layer 2 is often concaved roundly so that the hypothetical plane including a side face of the adhesive layer 2 means that plane which most closely represents or assimilates the side face of the adhesive layer 2. In practice, the rounded edges of the adhesive layer 2 of 10 micrometer or smaller radius are rounded so slightly, in comparison to the magnitude of the wavelengths of the exposure lights currently in use, that the phenomenon of the edges creeping and coming in tacky contact with the flat surface of the mask as the adhesive layer 2 is imposed on the mask gives rise to no such mask deformation as to cause light image deformation or translation. Incidentally, in FIG. 1(b), the side faces of the adhesive layer 2 are represented by respective straight lines but, as said above, they are generally concaved inwardly. The extent to which the side faces are concaved is not an essential matter of the present invention.

Now, with reference to FIG. 2, one of the methods by which such adhesive layer as described above is formed will be explained. In FIG. 2, an adhesive 2 is first applied to the mask-bonding frame face of the pellicle frame 1; then, in order to flatten the bottom face of the adhesive layer 2, the frame is brought placed on a flat plate [ref. (a)]. On this occasion, the viscosity of the adhesive layer 2 is controlled to a desirable degree. Then, the distance between the flat plate 3 and the pellicle frame 1 is adjusted whereby some of the adhesive 2 flows downward and the side faces of the adhesive layer 2 become either vertical to the flat plate 3 or more often concaved inwardly [ref. (b)]. Then, the adhesive layer 2 is cured to harden to an extent that the adhesive surface retains sufficient tackiness and, the pellicle frame is removed from the flat plate 3 preserving the shape of the adhesive layer 2 [ref. (c)].

FIG. 3 shows a step whereat the pellicle is attached to the mask 5. In the pellicle of the present invention, as described above, the angle theta of each of the foot edges of the adhesive layer 2 is 270 degrees or greater, so that when the pressure for attaching the pellicle is imposed, the side faces of the adhesive layer 2 do not bulge beyond the flattened bottom face of the adhesive layer 2 to come in contact with and to be stuck to the upper face of the mask 5, and even if the adhesive bulged beyond the flattened bottom face of the adhesive layer 2, the amount of the adhesive that creeps beyond would so small to affect the lithography. Therefore, by using a pellicle of the present invention in lithography, it is possible to avoid significant deformation of the mask.

EMBODIMENT OF THE INVENTION

Example

A pellicle frame was machined out of an aluminum alloy to have an outer dimension of 149 mm×115 mm, the frame bar being 4.5 mm high and 2 mm wide, and the width of the adhesive-receiving face of the frame bar being 1.6 mm on account of the existence of chamfers along the frame edges; the frame was washed in pure water, and was fixed in a frame holder. An acrylic resin adhesive (SK-1473H) manufactured by Soken Chemical & Engineering Co., Ltd., as the mask-bonding adhesive, was applied to one of the two adhesive-receiving faces of the frame, and immediately thereafter, the pellicle frame was detached from the frame holder with the adhesive coated face looking downward, and this adhesive layer was brought in contact with a 75-micrometer thick separator made of PET and placed on a quartz flat plate to thereby mold the adhesive layer. When 4 hours have passed from this, the adhesive layer was heated at 90 degrees centigrade to harden, and then the pellicle frame was fixed in the frame holder and the separator was peeled off the adhesive layer.

A CITOP adhesive (CTX-A) manufactured by ASAHI GLASS CO., LTD., as the membrane-bonding adhesive, was applied to the other adhesive-receiving face of the frame. Thereafter, the pellicle frame was heated at 130 degrees centigrade, and both of the adhesives were hardened. Next, the pellicle frame was brought onto a pellicle membrane temporarily attached to a frame made of aluminum having a wider dimension than the pellicle frame in a manner such that the CTX-A bearing frame face was bonded to the pellicle membrane, and that part of the membrane which extends beyond the pellicle frame was trimmed off, whereupon a pellicle is completed.

The thickness of the mask-bonding adhesive layer of the thus completed pellicle was 0.3 mm, and the width of the mask-bonding adhesive layer where the bottom face was flattened was 1.8 mm. The angle between the flattened bottom face and each of the side faces of the mask-bonding adhesive layer was about 270 degrees.

When this pellicle was bonded to a mask having a flatness of 0.25 micrometer, the mask's flatness did not vary from 0.25 micrometer, which was a favorable result.

Comparative Example

A pellicle frame was machined out of an aluminum alloy to have an outer dimension of 149 mm×115 mm, the frame bar being 4.5 mm high and 2 mm wide, and the width of the adhesive-receiving face of the frame bar being 1.6 mm on account of the existence of chamfers along the frame edges; the frame was washed in pure water, and was fixed in a frame holder. An acrylic resin adhesive (SK-1473H) manufactured by Soken Chemical & Engineering Co., Ltd., as the mask-bonding adhesive, was applied to one of the two adhesive-receiving faces of the frame, and after two hours of standstill, the pellicle frame was detached from the frame holder with the adhesive coated face looking downward, and this adhesive layer was brought in contact with a 75-micrometer thick separator made of PET and placed on a quartz flat plate to thereby mold the adhesive layer. When 4 hours have passed from this, the adhesive layer was heated at 90 degrees centigrade to harden, and then the pellicle frame was fixed in the frame holder and the separator was peeled off the adhesive layer.

A CITOP adhesive (CTX-A) manufactured by ASAHI GLASS CO., LTD., as the membrane-bonding adhesive, was applied to the other adhesive-receiving face of the frame. Thereafter, the pellicle frame was heated at 130 degrees centigrade, and both of the adhesives were hardened. Next, the pellicle frame was brought onto a pellicle membrane temporarily attached to a frame made of aluminum having a wider dimension than the pellicle frame in a manner such that the CTX-A bearing frame face was bonded to the pellicle membrane, and that part of the membrane which extends beyond the pellicle frame was trimmed off, whereupon a pellicle is completed.

The thickness of the mask-bonding adhesive layer of the thus completed pellicle was 0.3 mm, and the width of the mask-bonding adhesive layer where the bottom face was flattened was 1.2 mm. The angle between the flattened bottom face and each of the side faces of the mask-bonding adhesive layer was about 225 degrees.

When this pellicle was bonded to a mask having a flatness of 0.25 micrometer, the mask's flatness varied to 0.27 micrometer.

EXPLANATION FOR REFERENCE NUMERALS

1: pellicle frame
2: mask-bonding adhesive (layer)
3: edge (where a side face and a flatted bottom face of adhesive layer meet)
4: flat plate
5: mask
θ: angle included between a side face and a flattened bottom face of adhesive layer
11: pellicle frame
12: mask-bonding adhesive (layer)
13: flat plate
14: flattened bottom face of mask-bonding adhesive layer
15: a tangential line
16: mask

What is claimed is:

1. A pellicle for lithography comprising a pellicle frame having a pair of parallel frame faces, a pellicle membrane tensely bonded on one of the frame faces, and a mask-bonding adhesive layer attached to the other one of the frame faces, characterized in that said mask-bonding adhesive layer has a corner-rounded cross section in a shape akin to a trapezoid of which a first one of two parallel sides represents the face of the mask-bonding adhesive layer by which the adhesive layer is attached to the pellicle frame, and in that a second one of the two parallel sides of the trapezoid is not shorter than the first parallel side, and in that base angles of the trapezoid are 90 degrees or smaller, the second parallel side being assumed the base of the trapezoid.

2. The pellicle according to claim 1 characterized in that said trapezoid is a rectangle and said base angles are 90 degrees.

3. The pellicle according to claim 1 characterized in that said base angles are greater than 75 degrees.

4. The pellicle according to claim 1 characterized in that said trapezoid has inwardly concaved legs.

* * * * *